(12) United States Patent
Brcka

(10) Patent No.: US 10,431,425 B2
(45) Date of Patent: Oct. 1, 2019

(54) POLY-PHASED INDUCTIVELY COUPLED PLASMA SOURCE

(71) Applicant: Tokyo Electron Limited, Minato-ku, Tokyo (JP)

(72) Inventor: Jozef Brcka, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 66 days.

(21) Appl. No.: 15/084,143

(22) Filed: Mar. 29, 2016

(65) Prior Publication Data
US 2017/0243720 A1    Aug. 24, 2017

Related U.S. Application Data

(60) Provisional application No. 62/298,766, filed on Feb. 23, 2016.

(51) Int. Cl.
*H01J 37/32* (2006.01)

(52) U.S. Cl.
CPC ..... *H01J 37/3211* (2013.01); *H01J 37/32128* (2013.01); *H01J 37/32183* (2013.01)

(58) Field of Classification Search
USPC .......................................... 315/111.21–111.81
See application file for complete search history.

(56) References Cited

U.S. PATENT DOCUMENTS

| | | | |
|---|---|---|---|
| 5,936,352 A * | 8/1999 | Samukawa | H01J 37/32082 118/723 I |
| 6,164,241 A * | 12/2000 | Chen | H01J 37/321 118/723 I |
| 6,451,161 B1 * | 9/2002 | Jeng | H01J 37/321 118/723 I |
| 6,469,448 B2 * | 10/2002 | Taguchi | H01J 37/321 118/723 I |
| 6,561,198 B1 * | 5/2003 | Drevillon | B08B 7/0035 118/723 MA |
| 7,673,583 B2 | 3/2010 | Brcka | |
| 7,785,441 B2 * | 8/2010 | Miyake | H01J 37/321 118/723 AN |
| 7,854,213 B2 | 12/2010 | Brcka | |

(Continued)

OTHER PUBLICATIONS

Y Nakagawa et al "New Plasma Source with an UHF (500 MHz) antenna" Thin solid films 281-282 (1996) p. 169-171.*

(Continued)

*Primary Examiner* — Dion Ferguson
*Assistant Examiner* — Srinivas Sathiraju
(74) *Attorney, Agent, or Firm* — Wood Herron & Evans LLP

(57) ABSTRACT

Embodiments of systems and methods for a poly-phased inductively coupled plasma source are described. In an embodiment, a system may include a metal source configured to supply a metal for ionized physical vapor deposition on a substrate in a process chamber. The system may also include a high-density plasma source configured to generate a dense plasma, the high-density plasma source comprising a plurality of inductively coupled antennas. Additionally, the system may include a substrate bias source configured to provide a potential necessary to thermalize and ionize the plasma. In such embodiments, each antenna is configured to receive power at a phase orientation determined according to a phase arrangement.

18 Claims, 11 Drawing Sheets

(56) References Cited

U.S. PATENT DOCUMENTS

| | | | |
|---|---|---|---|
| 7,880,392 B2 | 2/2011 | Kato et al. | |
| 7,967,944 B2* | 6/2011 | Shannon | H01J 37/32082 156/345.2 |
| 8,169,148 B2 | 5/2012 | Jeon et al. | |
| 8,629,068 B1* | 1/2014 | Shrinivasan | C23C 16/345 427/492 |
| 8,920,600 B2* | 12/2014 | Godyak | H01J 37/321 156/345.49 |
| 9,161,428 B2* | 10/2015 | Collins | H05H 1/46 |
| 9,325,282 B2* | 4/2016 | Bowers | H03F 3/195 |
| 9,337,000 B2* | 5/2016 | Marakhtanov | H01J 37/32183 |
| 9,577,349 B2* | 2/2017 | Helbers | H04B 1/40 |
| 2002/0140359 A1* | 10/2002 | Chen | H01J 37/321 315/111.21 |
| 2003/0150710 A1 | 8/2003 | Evans et al. | |
| 2005/0103445 A1* | 5/2005 | Brcka | H01J 37/321 156/345.48 |
| 2005/0266173 A1* | 12/2005 | Brcka | C23C 14/046 427/569 |
| 2006/0259198 A1* | 11/2006 | Brcka | G05B 19/4184 700/246 |
| 2007/0029193 A1* | 2/2007 | Brcka | C23C 14/345 204/298.02 |
| 2007/0095287 A1* | 5/2007 | Kato | H01J 37/321 118/723 AN |
| 2007/0176824 A1* | 8/2007 | Stumbo | H01Q 3/34 342/372 |
| 2007/0235319 A1* | 10/2007 | Cerio, Jr. | C23C 16/45529 204/192.1 |
| 2008/0203084 A1* | 8/2008 | Yamaga | F27B 17/0025 219/441 |
| 2008/0242065 A1* | 10/2008 | Brcka | H01J 37/32623 438/513 |
| 2008/0308409 A1* | 12/2008 | Brcka | H01J 37/32082 204/164 |
| 2009/0242385 A1* | 10/2009 | Robison | C23C 14/0641 204/192.11 |
| 2009/0295296 A1* | 12/2009 | Shannon | H01J 37/32082 315/111.21 |
| 2010/0063787 A1* | 3/2010 | Brcka | G06F 17/5009 703/6 |
| 2011/0079355 A1* | 4/2011 | Brcka | H01J 37/32623 156/345.24 |
| 2011/0115378 A1* | 5/2011 | Lubomirsky | H01J 37/32357 315/111.21 |
| 2012/0212135 A1* | 8/2012 | Suzuki | H01J 37/32926 315/111.21 |
| 2012/0247679 A1* | 10/2012 | Yamazawa | H01J 37/321 156/345.48 |
| 2012/0248066 A1* | 10/2012 | Yamazawa | H01J 37/321 216/68 |
| 2012/0329283 A1* | 12/2012 | Brcka | H01J 37/321 438/710 |
| 2013/0284370 A1* | 10/2013 | Collins | H05H 1/46 156/345.28 |
| 2014/0000686 A1* | 1/2014 | Mungekar | H01L 31/02167 136/252 |
| 2014/0076715 A1* | 3/2014 | Gorokhovsky | C23C 14/355 204/192.12 |
| 2015/0200075 A1* | 7/2015 | Godyak | H01J 37/321 315/111.51 |
| 2016/0133519 A1* | 5/2016 | Holden | H01L 21/78 438/462 |
| 2016/0155613 A1* | 6/2016 | Yamazawa | H01J 37/321 156/345.48 |
| 2017/0243720 A1* | 8/2017 | Brcka | H01J 37/32128 |
| 2017/0278686 A1* | 9/2017 | Brcka | H01J 37/3476 |

OTHER PUBLICATIONS

M J Kushner et al "A three-dimensional model for inductively coupled plasma etching reactors; Azimuthal symmetry, coil properties and comparison experiments" J. Appl. Phys. 80 (3) 1, Aug. 1996 p. 1337-1344.*

K Suzuki et al "Control of high-density plasma sources for CVD and etching" Vaccum 48 (7-9) 1997.*

International Patent Application No. PCT/US2017/017161, "International Search Report and Written Opinion," dated May 19, 2017, International filing date Feb. 9, 2017.

* cited by examiner

POLY-PHASED INDUCTIVELY COUPLED PLASMA SOURCE

CROSS-REFERENCE TO RELATED APPLICATIONS

This application is related by subject-matter to U.S. Patent Application No. 62/313,940, entitled "Ionized Physical Vapor Deposition (IPVD) Apparatus And Method For An Inductively Coupled Plasma Sweeping Source," filed Mar. 28, 2016, the contents of which are entirely incorporated herein.

BACKGROUND OF THE INVENTION

Field of Invention

The present invention relates to systems and methods for substrate processing, and more particularly to a poly-phased inductively coupled plasma source.

Description of Related Art

Scaling is a primary concern in semiconductor processing, both at the device level, and at the wafer level. At the device level, there is a constant drive to reduce the size or physical dimensions of features formed on or in the surface of the wafer. At the wafer level, on the other hand, there is a constant drive to increase the overall wafer size, so that more devices or features can be formed in a single set of process steps. Increased wafer size reduces overall device processing costs and efficiency.

Ideally, device consistency is improved with larger wafer size as well, but that may not always be the case, due to limitations of existing semiconductor fabrication tools. For example, a typical plasma source of an Ionized Physical Vapor Deposition (IPVD) system is generally not capable of providing a sufficiently uniform plasma field when used on wafers over 300 mm in size. In particular, uniformity is a substantial problem when the wafer size approached 450 mm, especially when system requirements dictate that the source non-uniformity be below 3%, as is typically the case.

Scaling and development of 450 mm capable IPVD represents a new level of complexity. Prior hardware solutions that include geometric scaling and operation modes to meet process requirements have been found to be either insufficient or too costly to implement when scaled toward 450 mm, particularly in applications where the IPVD is used to deposit barrier and seed layers into trenches and vias that form interconnects for Integrated Circuits (ICs). Although 300 mm IPVD tools have been previously developed, the 300 mm IPVD systems utilize a high-density plasma source inductively coupled plasma (ICP) with three-dimensional (3D) antennas. To scale such tools into 450 mm is difficult by mechanistic increase of dimensions, if not impossible, due to unknown optimal configuration and interplay of several sources inside the vacuum chamber. Such systems typically include three sub-sources: a metal source, a high density plasma source, and a substrate bias source.

In contrast to the "scaling up" of the individual components for IPVD source to adjust the tool to increased wafer size, the metallization features on the wafer are "scaled down" to follow trend that is generally referred in semiconductor fabrication as "Moore's law". Unfortunately, the physics of the plasma, such as interactions between electrons and atoms, is not scaled accordingly, and plasma has to be generated and sustained such that tradeoffs of both scaling challenges are balanced. There is a challenge to generate such a large plasma field, specifically plasma consisting of metal atoms and ions, and still meet process performance at the wafer surface, which may be 20 nm to 14 nm per node. At this metalization scale the critical dimensions of features for barrier and seed deposition are in the range of 32 nm to 12 nm. Another challenge is to provide system with high throughput but low cost of operation, which is still suitable for technology transition into 450 mm ranges at a mass fabrication level.

SUMMARY OF THE INVENTION

Embodiments of systems and methods for a poly-phased inductively coupled plasma source are described. In an embodiment, a system may include a metal source configured to supply a metal for ionized physical vapor deposition on a substrate in a process chamber. The system may also include a high-density plasma source configured to generate a dense plasma, the high-density plasma source comprising a plurality of inductively coupled antennas. Additionally, the system may include a substrate bias source configured to provide a potential necessary to thermalize and ionize the plasma. In such embodiments, each antenna is configured to receive power at a phase orientation determined according to a phase arrangement.

In an embodiment a method of processing metal or metal nitride films in a plasma processing system using large size substrates may include providing a large size substrate in a processing chamber. The method may also include generating from a metal source a sputtered metal onto the substrate. Additionally, the method may include creating a high density plasma from a poly-phased high density plasma source and applying the high density plasma according to a phase arrangement. Finally, the method may include controlling a phase of energy applied to the high-density plasma source according to the phase arrangement in order to meet one or more plasma processing objectives.

In a further embodiment, the one or more plasma processing objectives include improved ionization of a thermalized metal, uniform distribution of high density plasma, and/or capability of processing a range of large size substrates. Additionally, the phase arrangement may be selectable, according to one or more performance parameters. The phase arrangement specifies that the energy applied to the antennas is a similar phase, in one embodiment. Alternatively, the phase arrangement specifies that the energy applied to the antennas is a disparate phase. In still another embodiment, the phase arrangement specifies that the energy applied to the antennas is a combination of similar phases and disparate phases, the combination being defined by a predetermined phase pattern. In an embodiment, the predetermined phase pattern is dynamic over a set of time periods. In one embodiment, plasma density of the high-density plasma is dynamically adjusted based of the substrate size and requirements of the plasma processing system.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
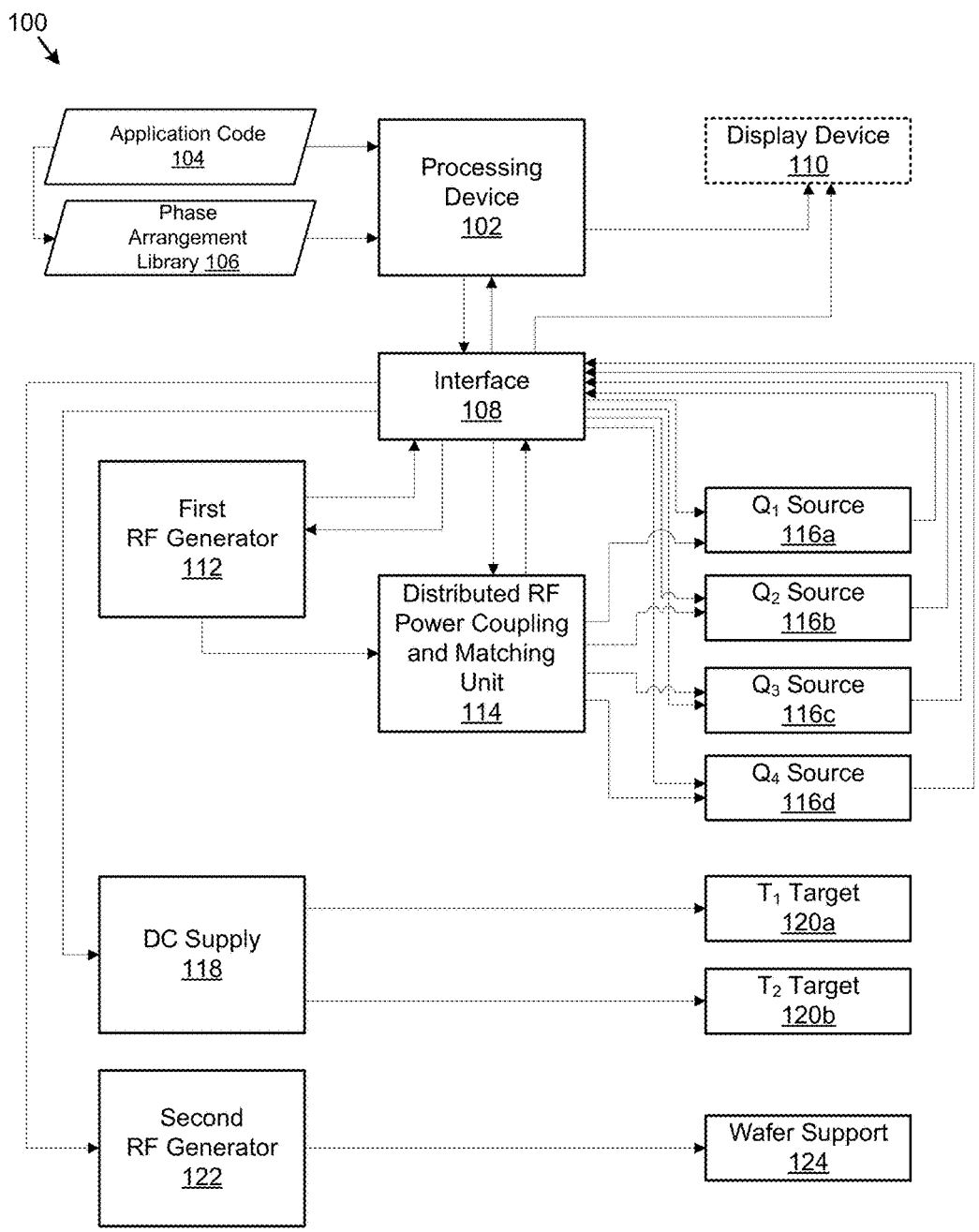
FIG. 1 illustrates one embodiment of a poly-phased inductively coupled plasma source.

Methods and systems for patterning sidewall shapes are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Embodiments of a poly-phased inductively coupled plasma source (PP-ICP) are described. In one embodiment, the PP-ICP includes multiple (at least two) high-density plasma sources in close proximity to one to another. In such embodiments, distribution of plasma depends upon a phase difference between the antennas. Advantageously, the apparatus may control plasma distribution by control of an applied phase to the individual antennae.

Referring now to the drawings, where like reference numerals designate identical or corresponding parts throughout the several views.

FIG. 1 illustrates one embodiment of an IPVD system 100 having an inductively coupled plasma sweeping source 116a-d. In some embodiments, the inductively coupled plasma sweeping source 116a-d may be arranged in a poly-phased configuration. In an embodiment, the system 100 includes a processing device 102, such as a computer, configured with application code 104 that is executable by the processing device for controlling the IPVD system 100. In an embodiment, the application code 104 references a phase arrangement library 106, and loads into the processing device 102 a sweeping algorithm suitable for a selected IPVD processing device 102 may display commands, data, and status information to a user via an optional display device 110. In some embodiments, at least one of the sweeping algorithm files or the application code 104 may be configured to control the phase of one or more of the ICP sweeping sources 116a-d.

Additionally, the processing device 102 may communicate with other system components via the interface 108. One of ordinary skill will recognize various embodiments of an interface which may be used according to the present embodiments, including for example a Peripheral Control Interface (PCI) interface, an RS-232 interface, and RS-485 interface, or the like. Additionally, the interface 108 may connect to the processing device 102, and optionally the display device 110, for feedback of system status information from the system components.

System components may include a first Radio Frequency (RF) generator 112, a distributed power coupling and matching unit 114, a Direct Current (DC) power supply 118, a second RF generator 122, and the like. Additional components may include one or more plasma sources 116a-d, one or more targets 120a-b, and a wafer support 124.

In an embodiment, the processing device 102 may communicate via the interface 108 with the described components to perform operations defined by a selected sweeping algorithm. For example, the first RF generator 112 may generate RF power at a selected frequency and magnitude. The RF power may be provided to the distributed RF power coupling and matching unit 114 for control and conditioning. The distributed RF power coupling and matching unit 114 may provide the conditioned RF power to the plasma sources 116a-d, which generate a sweeping plasma field within a plasma chamber (not shown). In some embodiments, the phase of the RF power provided to the plasma sources 116a-d by the RF coupling and matching unit 114 may be controlled, and in some embodiments controlled independently, for each source 116a-d. Examples of a distributed RF power coupling and matching unit 114 are described in greater detail below with reference to FIGS. 8-11. Further embodiments of plasma sources 116a-d are described below with reference to FIGS. 3-7.

In an embodiment the DC supply 118 may be configured to provide a DC bias current charge to one or more metal targets. For example, in the embodiment of FIG. 1, the system 100 includes a first target 120a and a second target 120b. Further embodiments of the targets 120a-b are described below with reference to FIGS. 3-6. The DC bias charge may cause the targets 120a-b to attract ions in the plasma field, thereby ejecting metal ions from the targets 120a-b into the plasma field.

In an embodiment, the second RF generator 122 may apply an RF bias to the wafer support 124, thereby directing metalized plasma ions onto the surface of a wafer (not shown) supported by the wafer support 124. In such an embodiment, metalized features, such as barrier and seed layers, may be deposited into trenches and vias that form interconnects for ICs.

Figure 2:
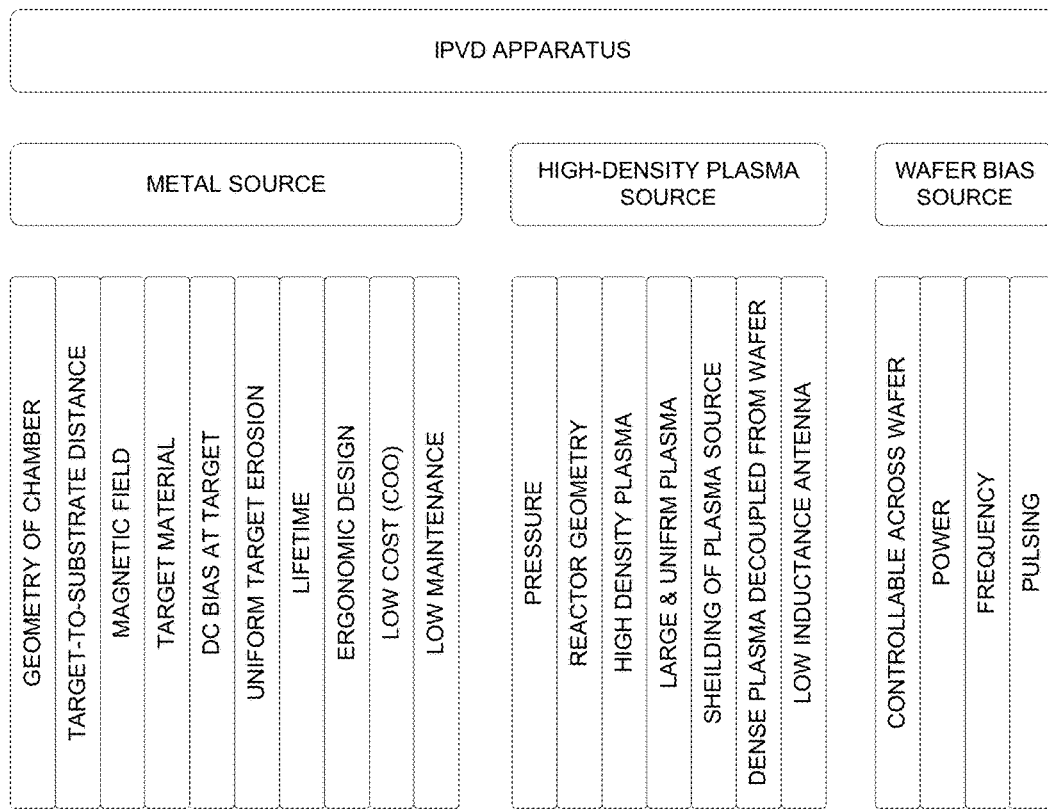
FIG. 2 illustrates one embodiment of characteristic components of a poly-phased inductively coupled plasma source.

FIG. 2 illustrates one embodiment of characteristic components of an IPVD system 100 having a poly-phased inductively coupled plasma source. As shown in FIG. 2, the IPVD system 100 may include three primary sources, a metal source, a high-density plasma source, and a wafer bias source. In general, the metal source is the target(s) 120a-b biased by the DC supply 118. In the embodiment of FIG. 1, the high-density plasma source includes the four plasma sources 116a-d, the distributed RF power coupling and matching unit 114, and the first RF generator 112. The wafer bias source may include the second RF generator 122 coupled to the wafer support 124.

In such embodiments, several characteristics or requirements impose limitations and design parameters for the metal source. Such characteristics include the geometry of the plasma chamber, the target-to-substrate distance, the magnetic field within the chamber, the type of target material to be bombarded, the DC bias level at the target, uniform target erosion requirements, desired metal source lifetime, ergonomic design, cost parameters for cost of ownership (COO), and maintenance requirements.

The neutral metal inside chamber is produced by metal source which is done by sputtering of the target surface. Metal transport from target is characterized by thermalization length. Thermalization length depends on pressure in chamber. The achievement of thermalization of the metal is important factor for efficient ionization of neutral metal. High ionization ratio of ionized metal to neutral metal and, more specifically, in respect also to plasma density is important for high aspect ratio (HAR) process performance at the wafer surface.

In an embodiment, the several parameters also place limitations on plasma source designs, including for example, plasma pressure requirements, reactor geometry, plasma density, plasma uniformity and size of the plasma field, shielding of plasma sources, plasma coupling to the wafer surface, and antenna design parameters, including the inductance of the antenna.

Further, the wafer bias source is also constrained by certain design parameters, including how controllable the bias charge is across the wafer, the power level, the frequency, pulsing, and other power fluctuations or patterns. One of ordinary skill will recognize further design parameters which may be considered when designing the IPVD systems described herein. For example, metallic ions are transported from high density plasma region by ambipolar diffusion towards a wafer surface and accelerated by sheath voltage. Sheath voltage is controlled by wafer bias power to provide uniform and conformal deposition of metal into HAR features. Beneficially, the embodiments of a poly-phased inductively coupled plasma source described herein may improve operations of at least the plasma source portion of the IPVD system when used on large scale wafers.

Figure 3:
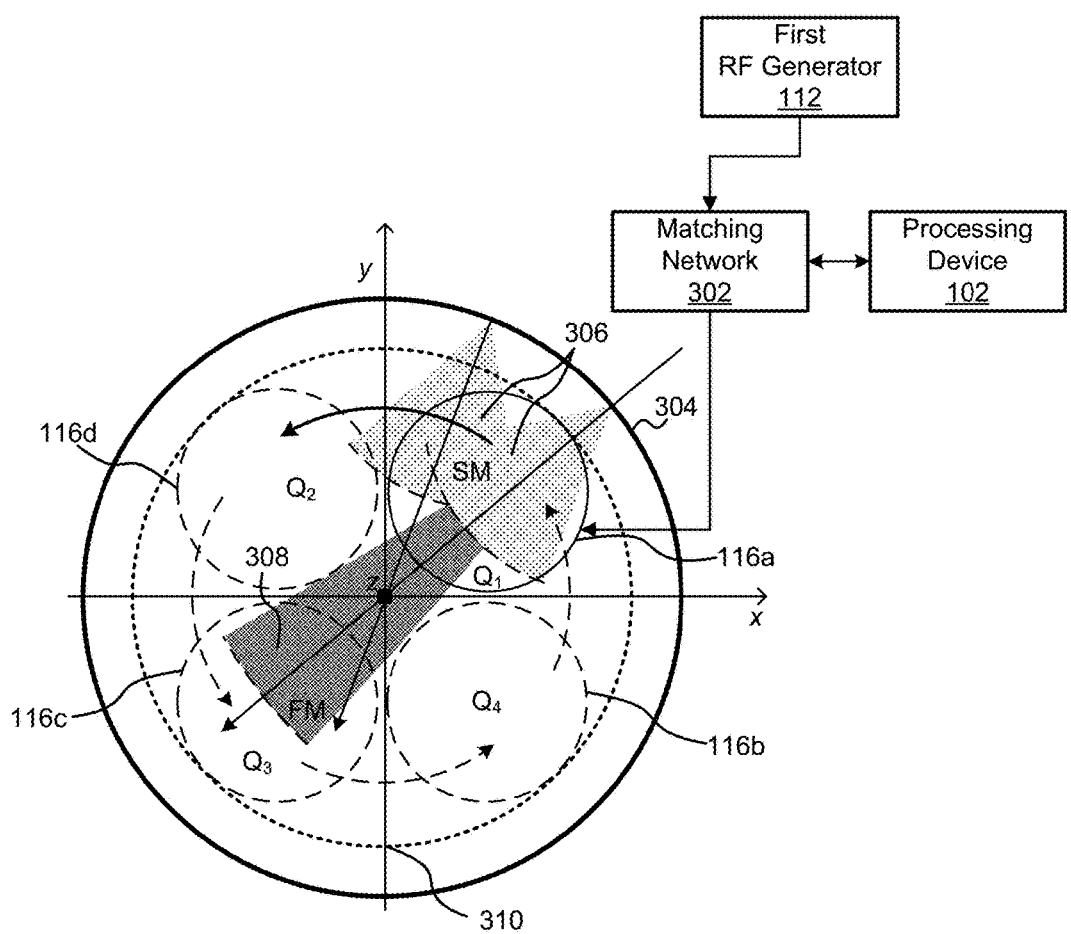
FIG. 3 illustrates one embodiment of an IPVD apparatus having a poly-phased inductively coupled plasma source.

FIG. 3 illustrates one embodiment of an IPVD apparatus having a poly-phased inductively coupled plasma source. In an embodiment, the plasma source includes a first RF generator 112 coupled to a matching network 302. The matching network may also be coupled to a processing device 102 configured to control the phase of power provided to each of the plasma sources 116a-d. In one embodiment the matching network 302 may be the distributed RF power coupling and matching unit 114 illustrated in FIG. 1.

In an embodiment, the matching network 302 may receive RF power from the first RF generator 112, and convey that power, in a controlled phase, to the plasma sources 116a-d (labeled Q1, Q4, Q3 and Q2, respectively). In an embodiment, a flux of slow metal atoms 306 and a flux of fast metal atoms 308 may be ejected by a source 304. Metal atoms are ionized in high density plasma field. The phase of the plasma sources 116a-d may rotate about an axis (z) in some embodiments, thereby sweeping the metal ions more uniformly within the chamber (not shown). An RF transparent deposition baffle 310 may further distribute the power generated by the plasma sources 116a-d.

In an embodiment, the power magnitude and frequency supplied by the first RF generator 112, the conditioning and patterning of the RF power supplied to the sources 116a-d by the matching network 302, the rate and pattern of source sweeping, the phase of power supplied to each source 116a-d, and the like, may each be controlled by the processing device 102 according to a selected sweeping algorithm.

The purpose of the sweeping mode is rather to create highly uniform plasma inside the chamber over a short time period and further modify plasma distribution in temporal (transient) manner to extremely uniform density of metal ion density. This approach is different than modifying static plasma distribution that is typically restricted by chamber geometry and does not offer sufficient in-situ flexibility to comply with process variation (ex-situ), particularly when applied in large-wafer applications.

The embodiment of FIG. 3 includes four high-density plasma sources (ICPs) 116a-d placed in individual quarters of the chamber, but the number of high-density plasma sources is not limited to four. Indeed, the number of sources depends on tradeoffs between development cost, complexity of operation, substrate size and process requirements. One of ordinary skill will recognize the greater or fewer number of sources may be used according to the present embodiments.

Metal is sputtered from the target 304 with axial symmetry and transported in radial direction passing through the ionization zone of the closest high-density plasma source (e.g., $Q_1$) where slow metal atoms 306 will get ionized and fast neutral atoms 308 will pass up to the ionization zone $Q_3$ and undergo ionization as well. Ionization zone $Q_1$ may be more effective to ionize sputtered flux from target at increased pressures (above 50 mTorr) and zone $Q_3$ is more effective at reduced pressures (below 50 mTorr). In fact, ionization both at "short" distance and "long" distance from target surface occurs instantly. Due to axial symmetry of the reactor, the transport described above also works for any other radial direction in proximity to the sweeping sources 116a-d in FIG. 3.

Thus, the neutral metal transport is directed through a high-density plasma region that provides efficient ionization of metallic neutrals. Individual high-density plasma sources 116a-d are represented by inductively coupled plasma. The ICP antennas are powered by single or multiple RF generators 112 through individual matching network 302 with reflected power controller to match plasma and antenna impedance. Biasing and/or phase shifting of the ICP sources $Q_1$, $Q_2$, $Q_3$ and $Q_4$ may be provided in an azimuthally sequential manner. However, in some embodiments, two or more non-sequential sources can also operate simultaneously. Therefore, the ICPs power may be controlled in various degrees of overlapping operation of at least two ICP sources.

Figure 4:
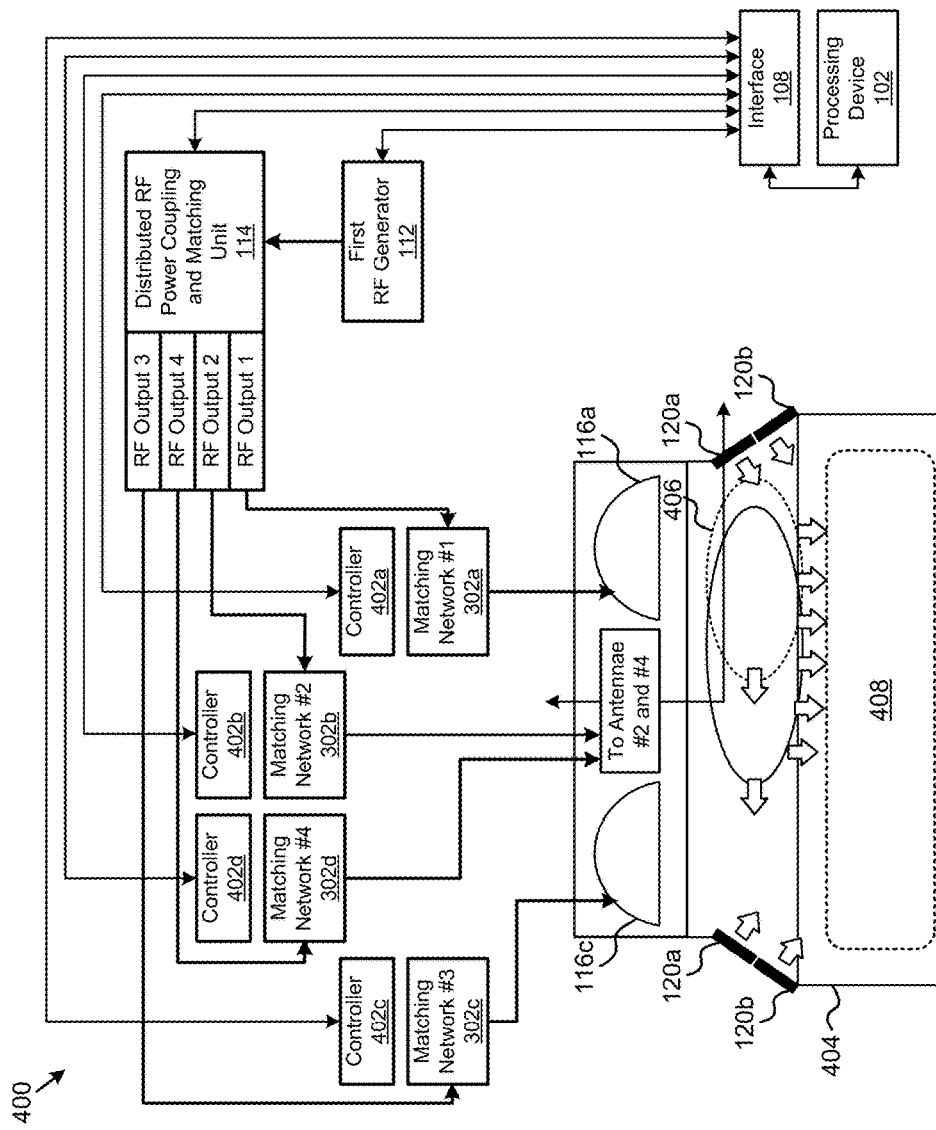
FIG. 4 illustrates a further embodiment of an IPVD system having a poly-phased inductively coupled plasma source.

FIG. 4 illustrates a further embodiment of an IPVD system 400 having a poly-phased inductively coupled plasma source. In an embodiment, the system 400 generally includes a sweeping high-density plasma source, a metal source, and a wafer bias source. In such an embodiment, the antennas 116a, 116c are illustrated. Each antenna 116a, 116c-116d is coupled to an RF generator 112 via an RF power distributed coupling unit 114, a controller 402a-d respectively, and a matching network 302a-d respectively. The matching networks 302a-d may provide impedance matching between the antennas 116a, 116c (116b and 166d not shown in FIG. 4) and RF power distributed coupling unit 114 respectively, to avoid reflections and transient signals, which may create inconsistencies in the plasma field distribution.

Sputtered metal from the targets 120a-b may be combined with the high-density plasma field 406 to form a thermalized and ionized metal plasma domain 408 over a surface of a wafer 410. The bias on the wafer provided by the wafer support 124 in FIG. 1, may cause the metal ions to be directed at the surface of the wafer 410.

Figure 5:
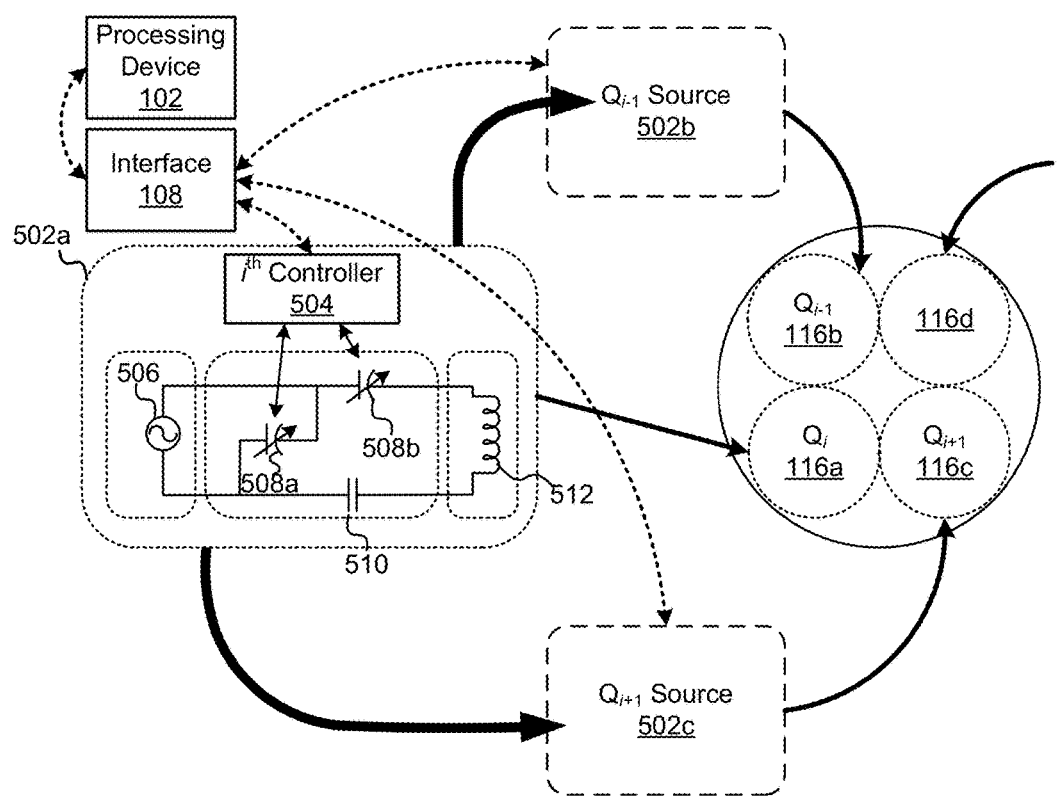
FIG. 5 illustrates a further embodiment of an IPVD system having a poly-phased inductively coupled plasma source.

In the embodiment of FIG. 5, the processing device 102 communicates with an independent controller 504 and matching unit 502a-502c, 502d not shown, for each source antenna. In such an embodiment, the first matching unit 502a may include a first adjustable capacitor 508a and a second adjustable capacitor 508b. A third capacitor 510 may also be coupled to an inductor 512 for inductively coupling the RF source 506 to the antenna 116a. While this embodiment is the simplest, it also becomes costly when using multiple ICP sources. On the other hand, it offers decoupled ICP sources with independent power delivery into each high-density plasma source 116a-d and also more standard HW may be used for each high density plasma source 116a-d.

Figure 6A:
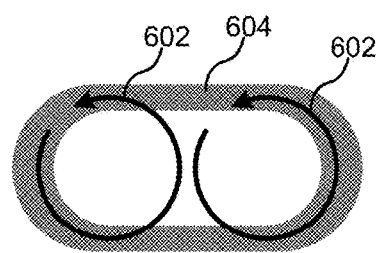
FIG. 6A illustrates one embodiment of a poly-phased inductively coupled plasma source.

FIG. 6A illustrates one embodiment of a poly-phased inductively coupled plasma source, illustrating an in-phase antenna arrangement. In the illustrated embodiment, two source antennas are arranged in close proximity. The antennas are charged with in-phase current as illustrated by the first phase 602. One of ordinary skill will recognize that there is not necessarily anything inherently "left-handed" about the current provided to the antennas, but that the left-handed circles representing the first phase 602 is merely representative of an arbitrary, but similar phase of power provided to the antennas. Such an arrangement may generate a plasma density pattern 604 as illustrated in FIG. 6A.

Figure 6B:
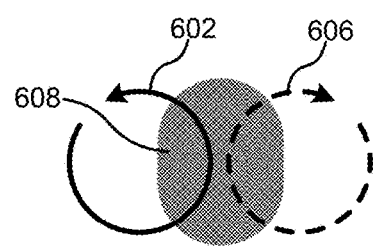
FIG. 6B illustrates another embodiment of a poly-phased inductively coupled plasma source.

FIG. 6B illustrates another embodiment of a poly-phased inductively coupled plasma source, illustrating an anti-phase antenna arrangement. In the illustrated embodiment, the first antenna may have the first phase 602, but the second antenna may have a second phase 606, which is different from the first phase 602. Likewise, one of ordinary skill will recognize that there is not necessarily anything inherently "right-handed" about the current provided to the antennas, but that the right-handed circles representing the second phase 606 is merely representative of an arbitrary, but dissimilar phase of power provided to the antennas, when compared with the first phase 602. Such an arrangement may generate a plasma density pattern 608 as illustrated in FIG. 6B.

Figure 7:
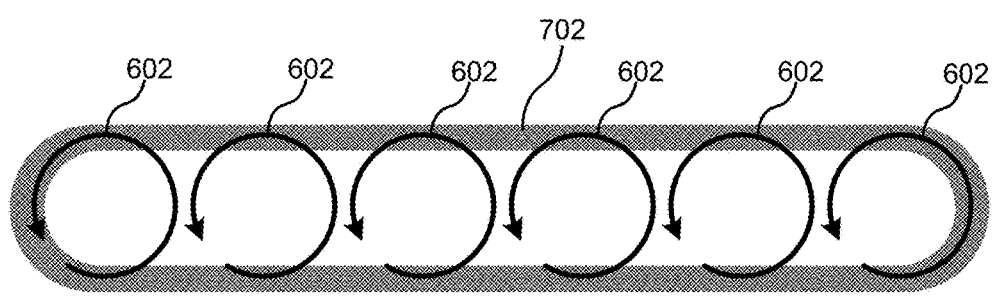
FIG. 7 illustrates another embodiment of a poly-phased inductively coupled plasma source.

FIG. 7 illustrates another embodiment of a poly-phased inductively coupled plasma source. In the embodiment of FIG. 7, a greater number of source antennas are provided. In the embodiment of FIG. 7, each of the six source antennas are powered with the energy in the first phase 602. Alternatively, each of the six source antennas may be powered with energy in the second phase 606 in FIG. 6B. In still another embodiment, a hybrid arrangement of antennas may be powered in various patterns of the first phase 602 and the second phase 606 in FIG. 6B, without limitation, in order to generate a plasma density pattern 702 that is variable according to the antenna configuration. Indeed, the number and physical arrangement of the source antennas may also be altered according to various embodiments.

Figure 8A:
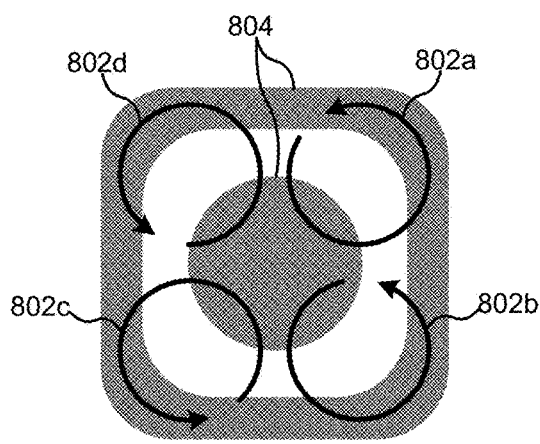
FIG. 8A illustrates another embodiment of a poly-phased inductively coupled plasma source.
Figure 9A:
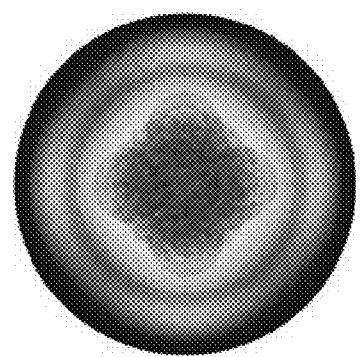
FIG. 9A illustrates a plasma field generated by the embodiment of FIG. 7A.
Figure 8B:
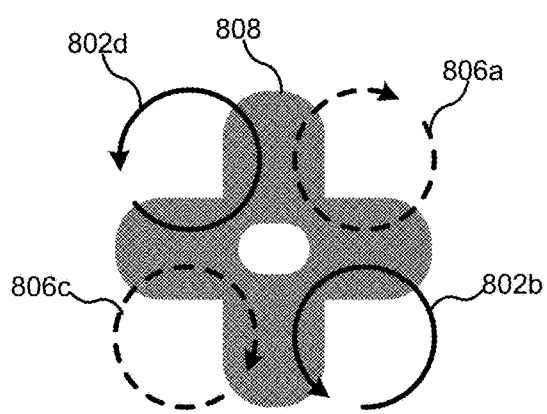
FIG. 8B illustrates another embodiment of a poly-phased inductively coupled plasma source.
Figure 8C:
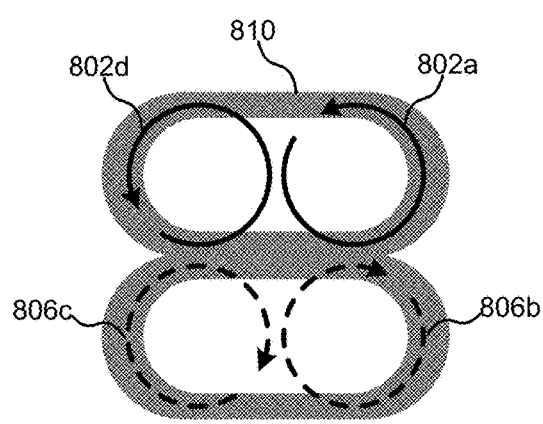
FIG. 8C illustrates another embodiment of a poly-phased inductively coupled plasma source.

For example, FIGS. 8A-C illustrate various alternative embodiments of an of a poly-phased inductively coupled plasma source having four source antennas. In the embodiment of FIG. 8A, each of the source antennas may be generally in-phase. Although the orientation of the antennas may be arranged such that the phase 802a-d of each of the antennas is slightly dissimilar, the overall effect is a generally in-phase arrangement. In such an embodiment, the plasma density pattern 804 may be generated. FIG. 9A illustrates a modeled plasma density pattern, which confirms that the plasma density pattern 804 is representative of the plasma density pattern generated by the four-antenna in-phase arrangement. In an alternative embodiment, the phase directions 802a, 802b, 802c, 802d are not necessarily in an identical phase, but rather in a cooperative phase arrangement.

FIG. 8B illustrates an anti-phase arrangement. In such an embodiment, the first antenna and the third antenna may be generally in-phase with each other as shown by phase 806a and 806c, and the second and fourth antenna may be generally in-phase with each other as shown by phase 802b and 802d; however, the two groups are generally out of phase with each other. The plasma density pattern 808 is a result of the anti-phase arrangement as confirmed by the model of FIG. 9B.

FIG. 8C illustrates an anti-phase arrangement. In such an embodiment, the first antenna and the fourth antenna may be generally in-phase with each other as shown by phase 802a and 802d, and the second and third antenna may be generally in-phase with each other as shown by phase 806b and 806c; however, the two groups are generally out of phase with each other. The plasma density pattern 810 is a result of the group-phase arrangement as confirmed by the model of FIG. 9C.

Figure 9B:
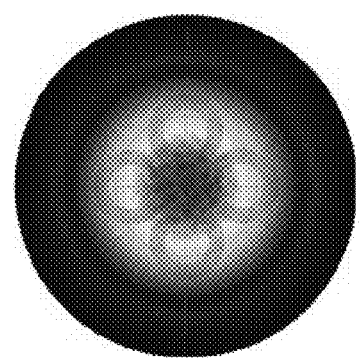
FIG. 9B illustrates a plasma field generated by the embodiment of FIG. 7B.
Figure 9C:
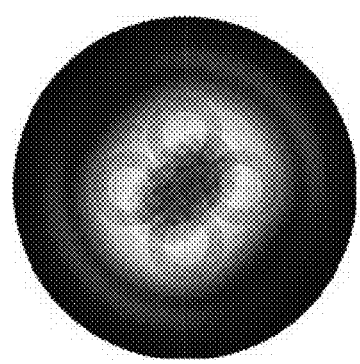
FIG. 9C illustrates a plasma field generated by the embodiment of FIG. 7C.

As shown by FIGS. 9A-9C, numerical models of the plasma density response confirm that the configurations of FIGS. 8A-C generate the plasma density patterns 804, 808, and 810 respectively.

Figure 10:
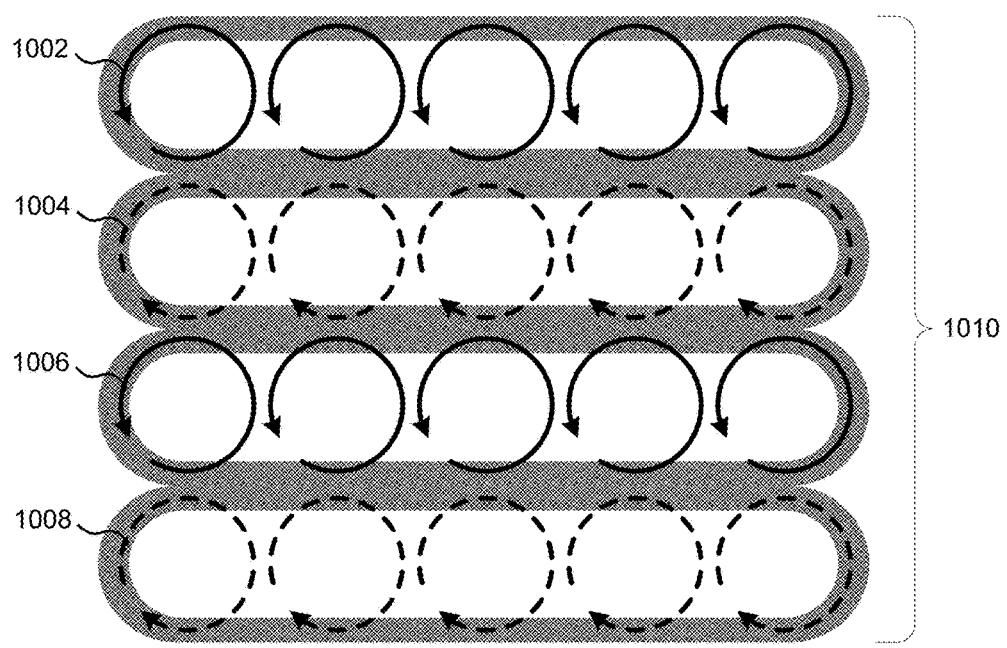
FIG. 10 illustrates another embodiment of a poly-phased inductively coupled plasma source.

FIG. 10 illustrates another embodiment of a poly-phased inductively coupled plasma source. In the embodiment of FIG. 10, the poly-phased inductively coupled plasma source comprises a plurality of rows of antennas, each row having an alternating phase. For example, each antenna in a first row 1002 may have a first phase, and each antenna in a second row 1004 may have a second phase. In a further embodiment, the third row 1006 may have the first phase and the fourth row may have the second phase. One of ordinary skill will recognize that alternative arrangements may exist, including arrangements where all of the rows 1002-1008 are of the same phase, etc. In such embodiments, a plasma pattern 1010 is generated.

Figures 11A, 11B, 11C, 11D:
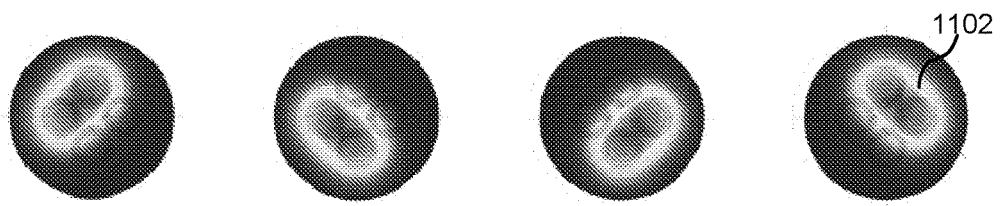
FIG. 11A illustrates a radiation pattern of an embodiment of a rotational poly-phased inductively coupled plasma source at a first time period.
FIG. 11B illustrates a radiation pattern of an embodiment of a rotational poly-phased inductively coupled plasma source at a second time period.
FIG. 11C illustrates a radiation pattern of an embodiment of a rotational poly-phased inductively coupled plasma source at a third time period.
FIG. 11D illustrates a radiation pattern of an embodiment of a rotational poly-phased inductively coupled plasma source at a fourth time period.
Figure 11E:
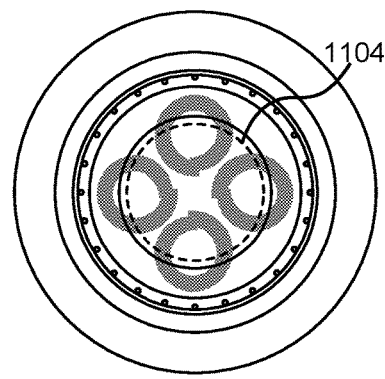
FIG. 11E illustrates an embodiment of the rotational poly-phased inductively coupled plasma source.
Figure 11F:
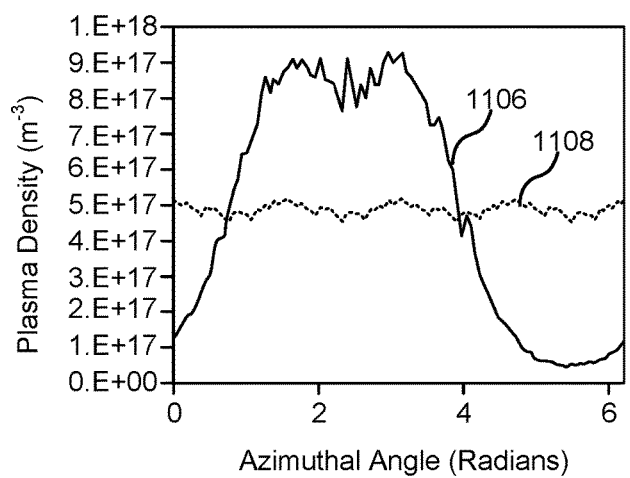
FIG. 11F illustrates a comparison of the plasma density at the fourth time period vs time-averaged plasma density generated by sequence of patterns from FIGS. 11A, B, C and D . . . .

FIG. 11A illustrates a radiation pattern of an embodiment of a rotational poly-phased inductively coupled plasma source at a first time period. FIG. 11B illustrates a radiation pattern of an embodiment of a rotational poly-phased inductively coupled plasma source at a second time period. FIG. 11C illustrates a radiation pattern of an embodiment of a rotational poly-phased inductively coupled plasma source at a third time period. FIG. 11D illustrates a radiation pattern of an embodiment of a rotational poly-phased inductively coupled plasma source at a fourth time period. In such an embodiment, a radiation pattern 1102 is generated at the fourth time period, which is represented by curve 1106 on the graph of FIG. 11F. As illustrated by curve 1108, the plasma density in the region defined by the ring 1104 of FIG. 11E is relatively constant during the rotation of the four time periods. Thus, relatively consistent deposition may be achieved over a large area, in such an embodiment.

Figure 12:
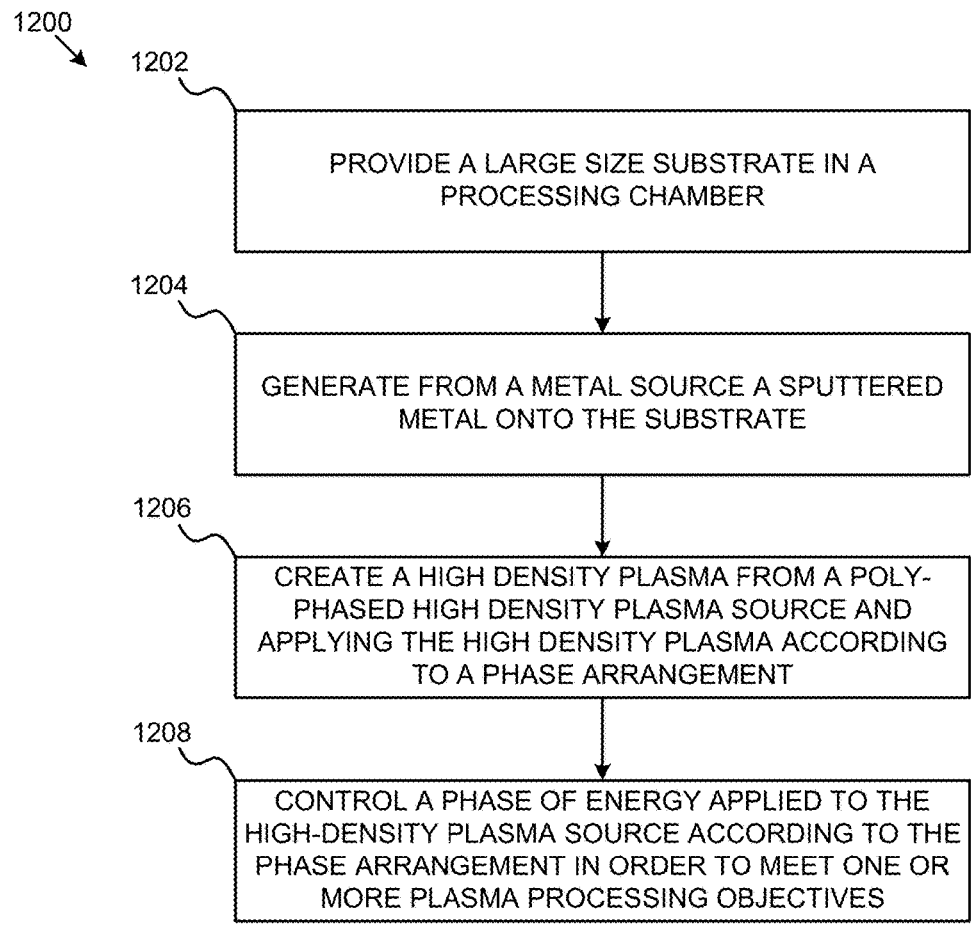
FIG. 12 is a flowchart diagram illustrating an embodiment of a method for operation of a poly-phased inductively coupled plasma source.

FIG. 12 is a flowchart diagram illustrating an embodiment of a method 1200 for operation of a poly-phased inductively coupled plasma source. In an embodiment, the method includes providing a large size substrate in a processing chamber, as illustrated at block 1202. The method 1200 also includes generating, from a metal source, a sputtered metal onto the substrate, as shown at block 1204. At block 1206, the method 1200 includes creating a high-density plasma from a poly-phased high-density plasma source and applying the high-density plasma according to a phase arrangement. At block 1208, the method includes controlling a phase of energy applied to the high-density plasma source according to the phase arrangement in order to meet one or more plasma processing objectives. Examples of plasma processing objectives are described above with relation to FIG. 2.

Figure 13:
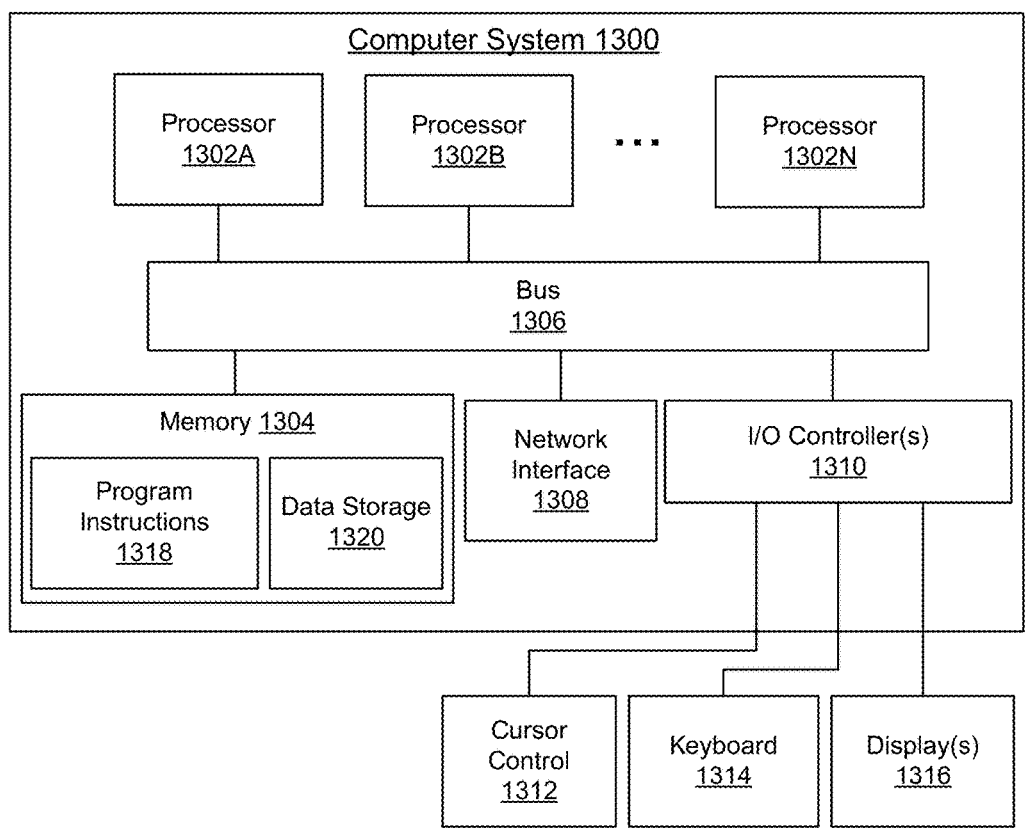
FIG. 13 is a schematic block diagram illustrating one embodiment of a computer system specially configured for use with a poly-phased inductively coupled plasma source.

FIG. 13 is a schematic block diagram illustrating one embodiment of a computer system 1300 specially configured for use with an IPVD system having a poly-phased inductively coupled plasma source. In one embodiment, the processing device 102 in FIG. 5, may be implemented on a computer system similar to the computer system 1300 described in FIG. 13. Similarly, controllers 504 in FIG. 5, may be implemented on a computer system similar to the computer system 1300 described in FIG. 13. Other components of the systems described herein may also be implemented on a computer system similar to the computer system 1300. In various embodiments, computer system 1300 may be a server, a mainframe computer system, a workstation, a network computer, a desktop computer, a laptop, or the like.

As illustrated, computer system 1300 includes one or more processors 1302A-N coupled to a system memory 1304 via bus 1306. Computer system 1300 further includes network interface 1308 coupled to bus 1306, and input/output (I/O) controller(s) 1310, coupled to devices such as cursor control device 1312, keyboard 1314, and display(s) 1316. In some embodiments, a given entity (e.g., processing device 102) may be implemented using a single instance of computer system 1300, while in other embodiments multiple such systems, or multiple nodes making up computer system 1300, may be configured to host different portions or instances of embodiments (e.g., controllers 504).

In various embodiments, computer system 1300 may be a single-processor system including one processor 1302A, or a multi-processor system including two or more processors 1302A-N (e.g., two, four, eight, or another suitable number). Processor(s) 1302A-N may be any processor capable of executing program instructions. For example, in various embodiments, processor(s) 1302A-N may be general-purpose or embedded processors implementing any of a variety of instruction set architectures (ISAs), such as the x86, POWERPC®, ARM®, SPARC®, or MIPS® ISAs, or any other suitable ISA. In multi-processor systems, each of processor(s) 1302A-N may commonly, but not necessarily, implement the same ISA. Also, in some embodiments, at least one processor(s) 1302A-N may be a graphics processing unit (GPU) or other dedicated graphics-rendering device.

System memory 1304 may be configured to store program instructions and/or data accessible by processor(s) 1302A-N. For example, memory 1304 may be used to store software program and/or database shown in FIG. 12. In various embodiments, system memory 1304 may be implemented using any suitable memory technology, such as static random access memory (SRAM), synchronous dynamic RAM (SDRAM), nonvolatile/Flash-type memory, or any other type of memory. As illustrated, program instructions and data implementing certain operations, such as, for example, those described above, may be stored within system memory 1304 as program instructions 1318 and data storage 1320, respectively. In other embodiments, program instructions and/or data may be received, sent or stored upon different types of computer-accessible media or on similar media separate from system memory 1304 or computer system 1300. Generally speaking, a computer-accessible medium may include any tangible, non-transitory storage media or memory media such as electronic, magnetic, or optical media—e.g., disk or CD/DVD-ROM coupled to computer system 1300 via bus 1306, or non-volatile memory storage (e.g., "flash" memory)

In an embodiment, bus 1306 may be configured to coordinate I/O traffic between processor 1302, system memory 1304, and any peripheral devices including network interface 1308 or other peripheral interfaces, connected via I/O controller(s) 1310. In some embodiments, bus 1306 may perform any necessary protocol, timing or other data transformations to convert data signals from one component (e.g., system memory 1304) into a format suitable for use by another component (e.g., processor(s) 1302A-N). In some embodiments, bus 1306 may include support for devices attached through various types of peripheral buses, such as a variant of the Peripheral Component Interconnect (PCI) bus standard or the Universal Serial Bus (USB) standard, for example. In some embodiments, the operations of bus 1306 may be split into two or more separate components, such as a north bridge and a south bridge, for example. In addition, in some embodiments some or all of the operations of bus 1306, such as an interface to system memory 1304, may be incorporated directly into processor(s) 1302A-N.

Network interface 1308 may be configured to allow data to be exchanged between computer system 1300 and other devices, such as other computer systems attached to data processor 102 as shown in FIG. 5, for example. In various embodiments, network interface 1308 may support communication via wired or wireless general data networks, such as any suitable type of Ethernet network, for example; via telecommunications/telephony networks such as analog voice networks or digital fiber communications networks; via storage area networks such as Fiber Channel SANs, or via any other suitable type of network and/or protocol.

I/O controller(s) 1310 may, in some embodiments, enable connection to one or more display terminals, keyboards, keypads, touch screens, scanning devices, voice or optical recognition devices, or any other devices suitable for entering or retrieving data by one or more computer system 1300. Multiple input/output devices may be present in computer system 1300 or may be distributed on various nodes of computer system 1300. In some embodiments, similar I/O devices may be separate from computer system 1300 and may interact with computer system 1300 through a wired or wireless connection, such as over network interface 1308.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

As shown in FIG. 13, memory 1304 may include program instructions 1318, configured to implement certain embodiments described herein, and data storage 1320, comprising various data accessible by program instructions 1318. For example, program instructions 1318 may include the application code 104 and/or the phase arrangement library 106. In an embodiment, program instructions 1318 may include software elements of embodiments illustrated in FIG. 12. For example, program instructions 1318 may be implemented in various embodiments using any desired programming language, scripting language, or combination of programming languages and/or scripting languages. Data storage 1320 may include data that may be used in these embodiments such as, for example, sweeping algorithm files. In other embodiments, other or different software elements and data may be included.

A person of ordinary skill in the art will appreciate that computer system 1300 is merely illustrative and is not intended to limit the scope of the disclosure described herein. In particular, the computer system and devices may include any combination of hardware or software that can perform the indicated operations. In addition, the operations performed by the illustrated components may, in some embodiments, be performed by fewer components or distributed across additional components. Similarly, in other embodiments, the operations of some of the illustrated components may not be performed and/or other additional operations may be available. Accordingly, systems and methods described herein may be implemented or executed with other computer system configurations.

Embodiments of controllers 504 described in FIG. 5 may be implemented in a computer system that is similar to computer system 1300. In one embodiment, the elements described in controllers 504 may be implemented in discrete hardware modules. Alternatively, the elements may be implemented in software-defined modules which are executable by one or more of processors 1302A-N, for example.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

The invention claimed is:

1. A system for plasma processing comprising:
a metal source configured to supply a metal for ionized physical vapor deposition on a substrate in a process chamber;
a high-density plasma source configured to generate a dense plasma, the high-density plasma source comprising a plurality of individual inductively coupled antennas arranged in a pattern around an axis in the process chamber;
a substrate bias source configured to provide a potential necessary to thermalize and further ionize the plasma;
the high density plasma source including a control system and matching network coupled with the plurality of antennas and configured to deliver power to each individual antenna at an individual phase orientation determined according to a phase arrangement;

the high density plasma source further configured, according to the phase arrangement, for dynamically varying the delivery of power and phase orientation over time to each individual antenna in the process chamber according to a phase pattern to dynamically vary the radiation pattern delivered to the plasma, and for delivering power, in the phase pattern, to a first group of antennas at a synchronized phase at a first time period, and then for sequentially delivering power to other different groups of the antennas at a synchronized phase progressively in the process chamber at further sequential time periods following the first time period for consistent plasma processing.

2. The system of claim 1, wherein the substrate is at least 300 mm.

3. The system of claim 1, wherein the phase arrangement is selectable.

4. The system of claim 1, wherein a group of antennas in the high-density plasma source comprises at least two individual antennas, and the high-density plasma source is configured to deliver power to each antenna in a similar individual phase orientation.

5. The system of claim 1, wherein a group of antennas in the high-density plasma source comprises at least two individual antennas, and the high-density plasma source is configured to deliver power to each antenna in a disparate individual phase orientation.

6. The system of claim 1, wherein the phase arrangement controls that the power is delivered to a group of antennas by the high-density plasma source as a combination of similar phases and disparate phases, according to a predetermined phase pattern.

7. The system of claim 1, wherein plasma density of the high-density plasma is dynamically varied according to the phase pattern based on the substrate size and requirements of the plasma processing system.

8. The system of claim 1, wherein the high-density plasma source comprises four antennas, the high-density plasma source configured to deliver power to at least one group of antennas according to an in-phase arrangement.

9. The system of claim 1, wherein the high-density plasma source comprises four antennas, the high-density plasma source configured to deliver power to at least one group of antennas according to an anti-phase arrangement.

10. The system of claim 1, wherein the high-density plasma source comprises four antennas, the high-density plasma source configured to deliver power to at least one group of antennas according to a group-phase arrangement.

11. The system of claim 1, wherein the high-density plasma source comprises four antennas arranged about the axis, the high-density plasma source configured to deliver power, in the phase pattern, to a first pair of antennas at a synchronized phase at the first time period, to a second pair of antennas at a synchronized phase at a second time period, to a third pair of antennas at a synchronized phase at a third time period, and to a fourth pair of antennas at a synchronized phase at a fourth time period.

12. The system of claim 1, further comprising delivering power to the groups of antennas at a synchronized phase in the phase pattern for dynamically rotating the power delivery about the axis of the pattern of antennas.

13. The system of claim 1, wherein the high-density plasma source comprises a plurality of antennas arranged in a pattern that includes a row, with power delivered to each antenna in a similar phase.

14. The system of claim 1, wherein the high-density plasma source comprises a pattern of antennas that includes a plurality of rows of antennas.

15. The system of claim 14, wherein power is delivered to each row of antennas according to an alternating phase.

16. The system of claim 1, wherein the high density plasma source comprises:
 a radio frequency (RF) generator configured to generate RF waves and coupled with the control system and matching network;
 a deposition baffle configured to be transparent to RF.

17. The system of claim 1, wherein the phase arrangement is defined by a phase arrangement file stored in a phase arrangement library.

18. The system of claim 1, further comprising an inductive element for inductively coupling the antennas to a phased power source.

* * * * *